United States Patent
Jiao et al.

(10) Patent No.: US 11,802,899 B2
(45) Date of Patent: Oct. 31, 2023

(54) APPARATUS AND METHOD FOR MEASURING MICROWAVE ELECTRIC FIELD AT CONTINUOUS FREQUENCIES BASED ON ALTERNATING CURRENT (AC) STARK EFFECT OF RYDBERG ATOMS

(71) Applicant: Shanxi University, Taiyuan (CN)

(72) Inventors: Yuechun Jiao, Taiyuan (CN); Jianming Zhao, Taiyuan (CN); Jingxu Bai, Taiyuan (CN)

(73) Assignee: Shanxi University, Taiyuan (CN)

( * ) Notice: Subject to any disclaimer, the term of this patent is extended or adjusted under 35 U.S.C. 154(b) by 0 days.

(21) Appl. No.: 17/865,701

(22) Filed: Jul. 15, 2022

(65) Prior Publication Data
US 2023/0236233 A1 Jul. 27, 2023

(30) Foreign Application Priority Data
Jan. 22, 2022 (CN) .......................... 202210075117.0

(51) Int. Cl.
*G01R 29/12* (2006.01)
(52) U.S. Cl.
CPC ................................... *G01R 29/12* (2013.01)
(58) Field of Classification Search
CPC . G01R 29/12; G01R 29/0871; G01R 29/0885
USPC ........................................................ 324/457
See application file for complete search history.

(56) References Cited

U.S. PATENT DOCUMENTS

| 4,215,320 A | * | 7/1980 | Chang | ..................... H01S 3/227 372/4 |
| 4,692,627 A | * | 9/1987 | Ueda | ....................... H01J 27/24 250/423 P |
| 2022/0196718 A1 | * | 6/2022 | Walker | ................... G01R 29/12 |

FOREIGN PATENT DOCUMENTS

| CN | 106707042 A | * | 5/2017 | |
| CN | 106470035 B | * | 7/2021 | ............ G02F 1/0126 |
| CN | 114487621 A | * | 5/2022 | .............. G01R 29/12 |
| CN | 114659630 A | * | 6/2022 | |

\* cited by examiner

*Primary Examiner* — Christopher P McAndrew
(74) *Attorney, Agent, or Firm* — Occhiuti & Rohlicek LLP

(57) ABSTRACT

An apparatus and a method for measuring a microwave electric field at continuous frequencies based on an alternating current (AC) Stark effect of Rydberg atoms. A cesium vapor cell is used as an atomic sample cell. A cesium atom is excited to a Rydberg state by using detection light and coupling light that are emitted by two laser light sources, an electromagnetically induced transparency spectrum is generated. Further, a strong electric field is used as a local field EL, to cause AC Stark frequency shift and splitting of a Rydberg energy level. $E_S$ of to-be-detected signal electric field is applied. In this case, the Rydberg atom serves as a frequency converter, to directly read a beat frequency signal $\Delta f$ of the local field and the signal field. From the beat signal, the strength of $E_s$ of signal filed can be directly read out.

7 Claims, 3 Drawing Sheets

APPARATUS AND METHOD FOR MEASURING MICROWAVE ELECTRIC FIELD AT CONTINUOUS FREQUENCIES BASED ON ALTERNATING CURRENT (AC) STARK EFFECT OF RYDBERG ATOMS

CROSS REFERENCE TO RELATED APPLICATION(S)

This patent application claims the benefit and priority of Chinese Patent Application No. 202210075117.0, filed on Jan. 22, 2022, the disclosure of which is incorporated by reference herein in its entirety as part of the present application.

TECHNICAL FIELD

The present disclosure relates to the field of electric field intensity measurement technologies, and in particular, to an apparatus and a method for measuring a microwave electric field at continuous frequencies based on an AC Stark effect of Rydberg atoms.

BACKGROUND ART

Accurate measurement of weak electric fields has great significance in the defense-related science and technology, aerospace and daily life. In a conventional electric field measurement method, a to-be-measured electric field is measured by using a pre-calibrated electric field meter. However, the electric field meter itself needs to be calibrated. A detection principle of the electric field meter is to use an electric field to induce a metal to generate a current. The metal itself may interfere with the to-be-measured electric field. Consequently, precision of the conventional measurement method is low sensitivity, and measurement sensitivity of the electric field meter is limited by a thermal noise limit. With the redefinition of international units and the rapid development of quantum measurement technologies, a measurement method based on an electromagnetically induced transparency Autler-Townes (EIT-AT) spectrum in resonance with levels of Rydberg atoms is developed. However, based on the method, only a specific electric field at a resonance frequency with an adjacent Rydberg energy level can be measured, and highly sensitive measurement for an arbitrary frequency cannot be implemented.

SUMMARY

To resolve disadvantages and shortcomings of the prior art, an apparatus and a method for measuring a microwave electric field at continuous frequencies based on an AC Stark effect of Rydberg atoms are provided. In conventional electric field intensity measurement, there is a large error and pre-calibration needs to be performed. Measurement for an electric field at an arbitrary frequency cannot be implemented according to an existing method based on an electromagnetically induced transparency Autler-Townes (EIT-AT) spectrum in resonance with Rydberg levels. A method and apparatus for measuring a microwave electric field at continuous frequencies based on an AC Stark effect of Rydberg atoms are provided. A local field is used as a gain to improve detection sensitivity of Rydberg atoms. Further, a to-be-measured signal field and the local field have a beat frequency in the Rydberg atoms. Therefore, measurement for the electric field at an arbitrary frequency can be implemented by measuring a magnitude of a beat frequency signal. In the method, measurement is directly performed based on atomic parameters and has extremely high measurement precision.

To implement an object of the present disclosure, an apparatus and a method for measuring a microwave electric field at continuous frequencies based on an AC Stark effect of Rydberg atoms are provided. The apparatus includes an electric field measurement meter, where the electric field measurement meter includes a first laser light source, a second laser light source, and a local field, there are two channels along a laser propagation direction of the first laser source, an 852 nm half-wave plate, an 852 nm polarization splitting prism, an 852 nm polarization rotator, and a cesium sample cell are provided successively on one channel, and a high reflectivity reflector and a second photoelectric detector are provided successively on the other channel;

a 510 nm half-wave plate, a 510 nm polarization splitting prism, and a dichroic mirror with high penetration at 852 nm and high reflectance at 510 nm are provided successively along a laser propagation direction of the second laser light source, and a 510 nm polarization rotator and a first photoelectric detector are provided respectively on two sides of the dichroic mirror with high penetration at 852 nm and high reflectance at 510 nm;

the first photoelectric detector and the second photoelectric detector are connected to a subtractor; and the local field is used to act on an electromagnetically induced transparency spectrum, to cause AC Stark frequency shift and splitting of the electromagnetically induced transparency spectrum.

Further improvements to the foregoing solutions include the following steps:

Step 1: emitting, by a first laser light source, a laser with a wavelength of 852 nm as detection light, where a frequency of the detection light is locked to a resonance transition line of a ground state $6S_{1/2}$ (F=4) of a cesium atom to a first excited state $6P_{3/2}$ (F'=5); dividing the detection light into two beams by passing through an 852 nm half-wave plate and an 852 nm polarization splitting prism, where one beam passes through an 852 nm polarization rotator, and is incident from one end of a cesium sample cell to the cesium sample cell of a glass cesium bubble filled with cesium vapor, the detection light transmitted through the cesium sample cell passes through a 510 nm polarization rotator and a dichroic mirror with high penetration at 852 nm and high reflectance at 510 nm, and is incident to a first photoelectric detector for detection, and the other beam is used as reference light, passes through a high reflectivity reflector, and is incident to a second photoelectric detector for detection; and performing, by a subtractor, subtraction on signals output by the first photoelectric detector and the second photoelectric detector, to remove impact of a power wave of the laser on an experiment;

Step 2: emitting, by a second laser light source, a laser with a wavelength of 510 nm as coupling light, where the coupling light couples the first excited state $6P_{3/2}$ (F'=5) of the cesium atom to a Rydberg energy level $nD_{5/2}$, and the coupling light passes through the 510 nm half-wave plate, a 510 nm polarization splitting prism, the dichroic mirror with high penetration at 852 nm and high reflectance at 510 nm, and the 510 nm polarization rotator, is incident from the other end of the cesium sample cell to the cesium sample cell, and propagates anti-collinearly with the detection light in the cesium sample cell;

Step 3: meeting, by frequencies of the two lasers emitted by the first laser light source and the second laser light source, an electromagnetically induced transparency condition of a ladder-type three-energy-level system of a cesium $nD_{5/2}$ Rydberg state; and scanning a frequency of coupling light with a wavelength 510 nm near a resonance transition line from the first excited state $6P_{3/2}$ (F'=5) to the Rydberg energy level $nD_{5/2}$, to enable the first photoelectric detector to detect a Doppler-free electromagnetically induced transparency spectrum of the 852 nm detection light;

Step 4: undergoing, by the electromagnetically induced transparency spectrum under a local field, AC Stark frequency shift and splitting, where under the local field, the electromagnetically induced transparency spectrum in an $nD_{5/2}$ Rydberg state is frequency shifted and split into energy levels of magnetic quantum numbers $m_j=1/2$, 3/2, and 5/2, because the energy level $m_j=1/2$ has highest polarizability, the frequency of the 510 nm coupling light is locked to an energy level with high polarizability that is of a Rydberg state atom being frequency shifted, that is, the frequency of the 510 nm coupling light is locked to a resonance transition line, with the energy level $m_j=1/2$, from the first excited state $6P_{3/2}$ (F'=5) to the Rydberg energy level $nD_{5/2}$; and Step 5: placing an electric field measurement meter in a to-be-measured electric field, fixing an intensity of the local field, and scanning a frequency of the local field, where when a frequency difference between the local field and the to-be-measured electric field is less than 10 MHz, a beat frequency signal P may be observed in the first photoelectric detector, an amplitude of the beat frequency signal P is proportional to a product $E_L E_S$ of the intensity of the local field and an intensity of the to-be-measured electric field, that is, $P \propto E_L E_S \cos(2\pi\Delta f \cdot t)$, $E_L$ and $E_S$ are respectively an electric field intensity of the local field and an electric field intensity of a signal field, $\Delta f$ is a frequency difference between the local field and the signal field, and t is time, therefore, when the intensity of the local field is fixed, a magnitude of an intensity of the to-be-measured electric field can be directly derived according to a magnitude of the beat frequency signal P, so as to measure a signal field intensity, and an electric field at an arbitrary frequency causes AC Stark frequency shift of an energy level in the $nD_{5/2}$ Rydberg state, so that the to-be-measured electric field is at an arbitrary continuous frequency.

As a further improvement of the foregoing solutions, the 852 nm half-wave plate and the 852 nm polarization splitting prism in step 1 constitute a power controller of the detection light.

As a further improvement of the foregoing solutions, the 852 nm polarization rotator in step 1 is configured to adjust polarization of the detection light.

As a further improvement of the foregoing solutions, the 510 nm half-wave plate and the 510 nm polarization splitting prism in step 2 constitute a power controller of the coupling light.

As a further improvement of the foregoing solutions, the 510 nm polarization rotator in step 2 is configured to adjust polarization of the coupling light.

As a further improvement of the foregoing solutions, the lasers that are of the first laser light source and the second laser light source and that are incident to the cesium sample cell in step 3 have a same polarization direction.

The present disclosure has the following beneficial effects:

Compared with the prior art, the present disclosure provides an apparatus and a method for measuring a microwave electric field at continuous frequencies based on an AC Stark effect of Rydberg atoms. By using high sensitivity of the Rydberg atom to an external electric field, and by using the local field to further increase sensitivity of the Rydberg level to the external electric field, measurement for the electric field at an arbitrary frequency can be implemented. In the present disclosure, measurement is directly performed based on an AC Stark effect of a Rydberg energy level. An electric field at an arbitrary frequency causes the AC Stark effect of the Rydberg energy level. Therefore, the present disclosure overcomes the technical problems and the disadvantage: In the conventional electric field intensity measurement, there is a large error and pre-calibration needs to be performed. The measurement for an electric field at an arbitrary frequency cannot be implemented according to the existing method based on an EIT-AT spectrum in resonance with Rydberg levels. The entire method is simple to implement. A vapor cell filled with cesium atoms is used as a medium, and does not interfere with the to-be-measured electric field. Therefore, the apparatus is simple, easy to implement miniaturization, and suitable for integration and widespread promotion.

BRIEF DESCRIPTION OF THE DRAWINGS

The specific embodiments of the present disclosure are described in further detail below with reference to the accompanying drawings.

DETAILED DESCRIPTION OF THE EMBODIMENTS

Figure 1:
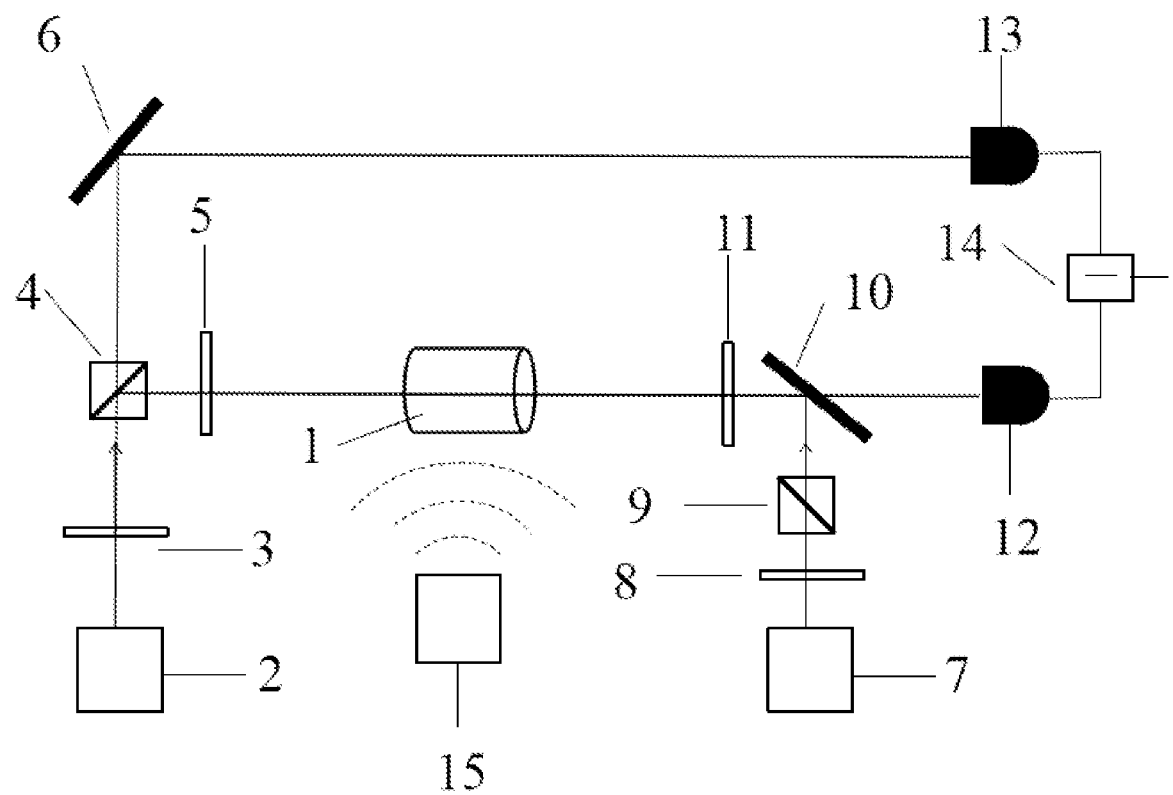
FIG. 1 is a schematic diagram of a structure of an apparatus according to the present disclosure.
Figure 2:
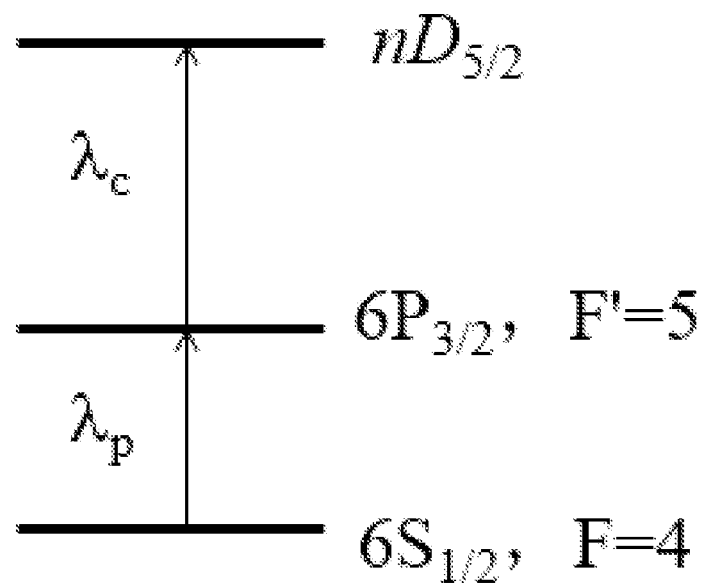
FIG. 2 is a schematic diagram of two-photon resonant excitation that meets an electromagnetically induced transparency condition of a Rydberg atom-based three-energy-level system according to the present disclosure, where in the figure, $\lambda_c$ is a wavelength of coupling light, and $\lambda_p$ is a wavelength of detection light.
Figure 3:
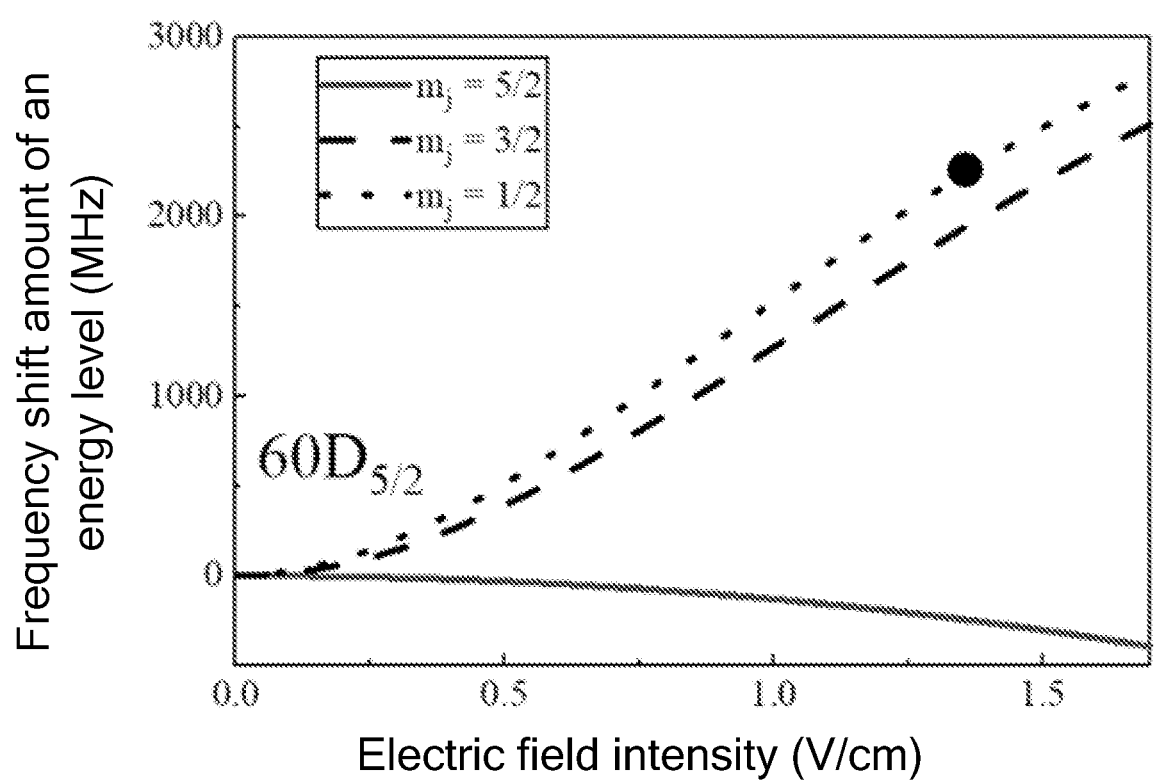
FIG. 3 is a schematic diagram of frequency shift and splitting of a Rydberg energy level $60D_{5/2}$ in a local field, where under the local field, the energy level $60D_{5/2}$ is frequency shifted and split into energy levels of magnetic quantum numbers $m_j=1/2$, 3/2, and 5/2, because the energy level $m_j=1/2$ has highest polarizability, the $nD_{5/2}$ and the energy level $m_j=1/2$ are selected to lock a frequency of 510 nm coupling light to a Rydberg energy level with high polarizability (that is, with a large slope), as shown by a circle in the figure.

As shown in FIG. 1 to FIG. 3, the present disclosure provides a method for measuring a microwave electric field at continuous frequencies based on an AC Stark effect of Rydberg atoms, including the following steps:

Step 1: A first laser light source (2) emits a laser with a wavelength of 852 nm as detection light. A frequency of the detection light is locked to a resonance transition line of a ground state $6S_{1/2}$ (F=4) of a cesium atom to a first excited state $6P_{3/2}$ (F'=5) thereof. The detection light is divided into two beams by passing through an 852 nm half-wave plate (3) and an 852 nm polarization splitting prism (4). One beam passes through an 852 nm polarization rotator (5), and is incident from one end of a cesium sample cell (1) to the cesium sample cell (1) of a glass cesium bubble filled with cesium vapor. The detection light transmitted through the cesium sample cell (1) passes through a 510 nm polarization rotator (11) and a dichroic mirror (10) with high penetration at 852 nm and high reflectance at 510 nm, and is incident to a first photoelectric detector (12) for detection. The other beam is used as reference light, passes through a high reflectivity reflector (6), and is incident to a second photoelectric detector (13) for detection. A subtractor (14) performs subtraction on signals output by the first photoelectric detector (12) and the second photoelectric detector (13), to remove impact of a power wave of the laser on an experiment. The 852 nm half-wave plate (3) and the 852 nm polarization splitting prism (4) in step 1 constitute a power controller of the detection light. The 852 nm polarization rotator (5) in step 1 is configured to adjust polarization of the detection light.

Step 2: A second laser light source (7) emits a laser with a wavelength of 510 nm as coupling light. The coupling light couples the first excited state $6P_{3/2}$ (F'=5) of the cesium atom to a Rydberg energy level $nD_{5/2}$. The coupling light passes through a 510 nm half-wave plate (8), a 510 nm polarization splitting prism (9), the dichroic mirror (10) with high penetration at 852 nm and high reflectance at 510 nm, and the 510 nm polarization rotator (11). The coupling light is incident from the other end of the cesium sample cell (1) to the cesium sample cell (1), and propagates anti-collinearly with the detection light in the cesium sample cell (1). The 510 nm half-wave plate (8) and the 510 nm polarization splitting prism (9) in step 2 constitute a power controller of the coupling light. The 510 nm polarization rotator (11) in step 2 is configured to adjust polarization of the coupling light.

Step 3: Frequencies of the two lasers emitted by the first laser light source (2) and the second laser light source (7) should meet an electromagnetically induced transparency condition of a ladder-type three-energy-level system of a cesium $nD_{5/2}$ Rydberg state. Scan a frequency of coupling light with a wavelength 510 nm near a resonance transition line from the first excited state $6P_{3/2}$ (F'=5) to the Rydberg energy level $nD_{5/2}$, to enable the first photoelectric detector (12) to detect a Doppler-free electromagnetically induced transparency spectrum of the 852 nm detection light. The lasers that are of the first laser light source (2) and the second laser light source (7) and that are incident to the cesium sample cell (1) in step 3 have a same polarization direction.

Step 4: The electromagnetically induced transparency spectrum undergoes, under a local field (15), AC Stark frequency shift and splitting. Under the local field (15), the electromagnetically induced transparency spectrum in an $nD_{5/2}$ Rydberg state is frequency shifted and split into energy levels of magnetic quantum numbers $m_j$=1/2, 3/2, and 5/2. Because the energy level $m_j$=1/2 has highest polarizability, the frequency of the 510 nm coupling light is locked to an energy level with high polarizability that is of a Rydberg state atom being frequency shifted. That is, the frequency of the 510 nm coupling light is locked to a resonance transition line, with the energy level $m_j$=1/2, from the first excited state $6P_{3/2}$ (F'=5) to the Rydberg energy level $nD_{5/2}$.

Step 5: Place an electric field measurement meter in a to-be-measured electric field, fix an intensity of the local field (15), and scan a frequency of the local field (15). When a frequency difference between the local field (15) and the to-be-measured electric field is less than 10 MHz, a beat frequency signal P may be observed in the first photoelectric detector (12). An amplitude of the beat frequency signal P is proportional to a product $E_L E_S$ of the intensity of the local field (15) and an intensity of the to-be-measured electric field. That is, $P \propto E_L E_S \cos(2\pi \Delta f \cdot t)$, $E_L$ and $E_S$ are respectively an electric field intensity of the local field and an electric field intensity of a signal field, $\Delta f$ is a frequency difference between the local field and the signal field, and t is time. Therefore, when the intensity of the local field is fixed, a magnitude of an intensity of the to-be-measured electric field can be directly derived according to a magnitude of the beat frequency signal P, so as to measure a signal field intensity. An electric field at an arbitrary frequency causes AC Stark frequency shift of an energy level in the $nD_{5/2}$ Rydberg state, so that the to-be-measured electric field is at an arbitrary continuous frequency.

Figure 4:
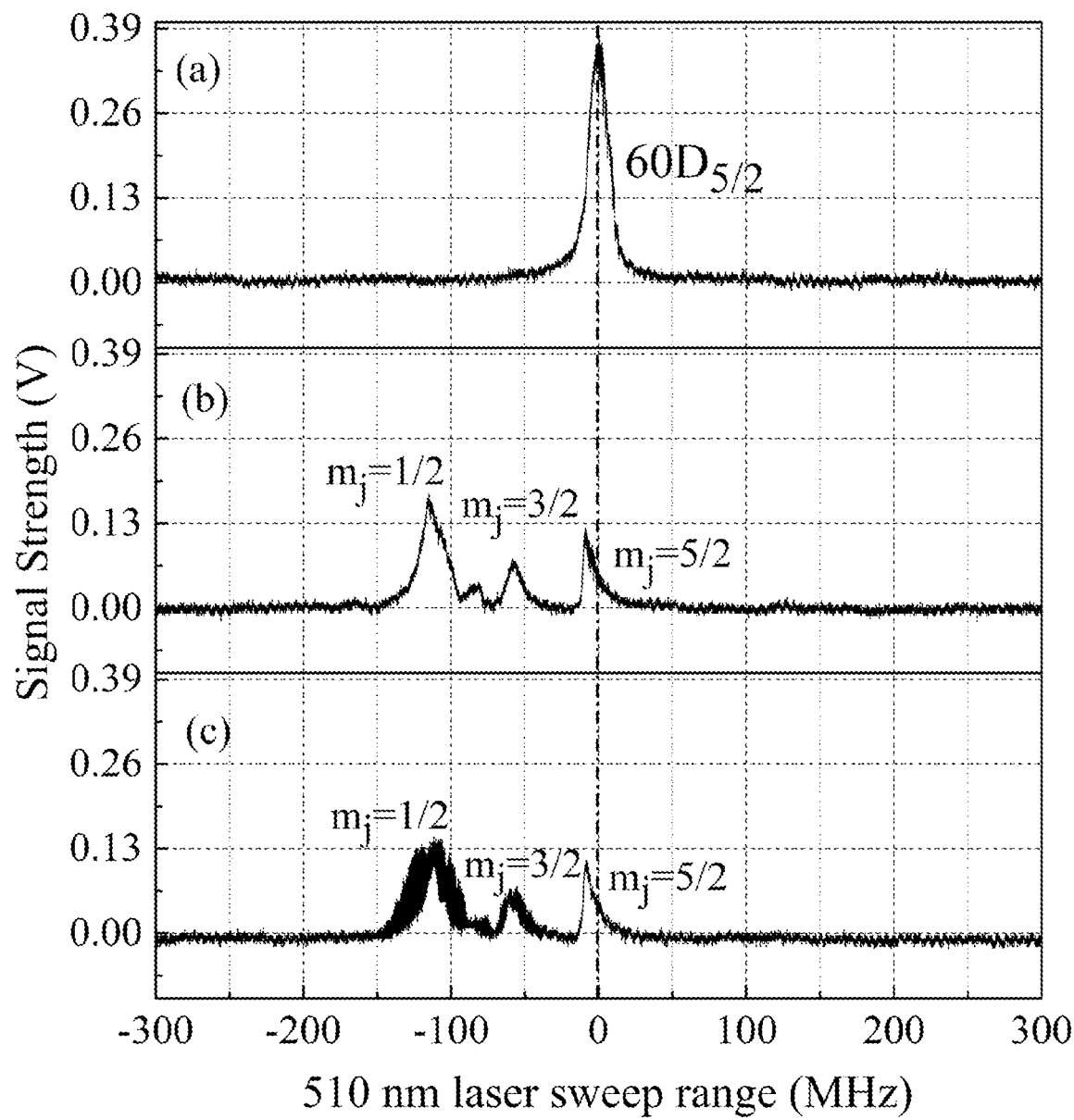
FIG. 4 is a schematic diagram of signal strength in a 510 nm laser sweep range according to the present disclosure, where (a) is an electromagnetically induced transparency spectrum without any electric field; (b) is an electromagnetically induced transparency spectrum with only a local electric field; and (c) is an electromagnetically induced transparency spectrum with both a local field and a signal field.

As shown in FIG. 4, it can be seen from (a) to (c) that after the two fields act simultaneously, modulation of the frequency difference between the two fields is performed on the spectral line.

The foregoing embodiments are not limited to the technical solutions of the embodiments, and the embodiments may be combined with each other to form new embodiments. The foregoing embodiments are merely intended to illustrate the technical solutions of the present disclosure, rather than limiting the present disclosure. Any modification or equivalent replacement without departing from the spirit and scope of the present disclosure shall fall within the scope of the technical solutions of the present disclosure.

What is claimed is:

1. An apparatus for measuring a microwave electric field at continuous frequencies based on an alternating current (AC) Stark effect of Rydberg atoms, comprising an electric field measurement meter, wherein the electric field measurement meter comprises a first laser light source, a second laser light source, and a local field, there are two channels along a laser propagation direction of the first laser source, an 852 nm half-wave plate, an 852 nm polarization splitting prism, an 852 nm polarization rotator, and a cesium sample cell are provided successively on one channel, and a high reflectivity reflector and a second photoelectric detector are provided successively on the other channel;

a 510 nm half-wave plate, a 510 nm polarization splitting prism, and a dichroic mirror with high penetration at 852 nm and high reflectance at 510 nm are provided successively along a laser propagation direction of the second laser light source, and a 510 nm polarization rotator and a first photoelectric detector are provided respectively on two sides of the dichroic mirror with high penetration at 852 nm and high reflectance at 510 nm;

the first photoelectric detector and the second photoelectric detector are connected to a subtractor; and the local field is used to act on an electromagnetically induced transparency spectrum, to cause AC Stark frequency shift and splitting of the electromagnetically induced transparency spectrum.

2. A method for measuring a microwave electric field at continuous frequencies based on an AC Stark effect of Rydberg atoms, applied to the measuring apparatus according to claim 1, and comprising the following steps:

step 1: emitting, by a first laser light source, a laser with a wavelength of 852 nm as detection light, wherein a frequency of the detection light is locked to a resonance transition line of a ground state $6S_{1/2}$ (F=4) of a cesium atom to a first excited state $6P_{3/2}$ (F'=5) thereof; dividing the detection light into two beams by passing through an 852 nm half-wave plate and an 852 nm polarization splitting prism, wherein one beam passes through an 852 nm polarization rotator, and is incident from one end of a cesium sample cell to the cesium sample cell of a glass cesium bubble filled with cesium vapor, the detection light transmitted through the cesium sample cell passes through a 510 nm polarization rotator and a dichroic mirror with high penetration at 852 nm and high reflectance at 510 nm, and is incident to a first photoelectric detector for detection, and the other beam is used as reference light, passes through a high reflectivity reflector, and is incident to a second photoelectric detector for detection; and performing, by a subtractor, subtraction on signals output by the first photoelectric detector and the second photoelectric detector, to remove impact of a power wave of the laser on an experiment;

step 2: emitting, by a second laser light source, a laser with a wavelength of 510 nm as coupling light, wherein the coupling light couples the first excited state $6P_{3/2}$ (F'=5) of the cesium atom to a Rydberg energy level $nD_{5/2}$, and the coupling light passes through a 510 nm half-wave plate, a 510 nm polarization splitting prism, the dichroic mirror with high penetration at 852 nm and high reflectance at 510 nm, and the 510 nm polarization rotator, is incident from the other end of the cesium sample cell to the cesium sample cell, and propagates anti-collinearly with the detection light in the cesium sample cell;

step 3: meeting, by frequencies of the two lasers emitted by the first laser light source and the second laser light source, an electromagnetically induced transparency condition of a ladder-type three-energy-level system of a cesium $nD_{5/2}$ Rydberg state; and scanning a frequency of coupling light with a wavelength 510 nm near a resonance transition line from the first excited state $6P_{3/2}$ (F'=5) to the Rydberg energy level $nD_{5/2}$, to enable the first photoelectric detector to detect a Doppler-free electromagnetically induced transparency spectrum of the 852 nm detection light;

step 4: undergoing, by the electromagnetically induced transparency spectrum under a local field, AC Stark frequency shift and splitting, wherein under the local field, the electromagnetically induced transparency spectrum in an $nD_{5/2}$ Rydberg state is frequency shifted and split into energy levels of magnetic quantum numbers $m_j$=1/2, 3/2, and 5/2, because the energy level $m_j$=1/2 has highest polarizability, the frequency of the 510 nm coupling light is locked to an energy level with high polarizability that is of a Rydberg state atom being frequency shifted, that is, the frequency of the 510 nm coupling light is locked to a resonance transition line, with the energy level $m_j$=1/2, from the first excited state $6P_{3/2}$ (F'=5) to the Rydberg energy level $nD_{5/2}$; and step 5: placing an electric field measurement meter in a to-be-measured electric field, fixing an intensity of the local field, and scanning a frequency of the local field, wherein when a frequency difference between the local field and the to-be-measured electric field is less than 10 MHz, a beat frequency signal P may be observed in the first photoelectric detector, an amplitude of the beat frequency signal P is proportional to a product ELES of the intensity of the local field and an intensity of the to-be-measured electric field, that is, P∝ELES cos (2π∆f·t), EL and ES are respectively an electric field intensity of the local field and an electric field intensity of a signal field, ∆f is a frequency difference between the local field and the signal field, and t is time, therefore, when the intensity of the local field is fixed, a magnitude of an intensity of the to-be-measured electric field is directly derived according to a magnitude of the beat frequency signal P, so as to measure a signal field intensity, and an electric field at an arbitrary frequency causes AC Stark frequency shift of an energy level in the $nD_{5/2}$ Rydberg state, so that the to-be-measured electric field is at an arbitrary continuous frequency.

3. The method for measuring a microwave electric field at continuous frequencies based on an AC Stark effect of Rydberg atoms according to claim 2, wherein the 852 nm half-wave plate and the 852 nm polarization splitting prism in step 1 constitute a power controller of the detection light.

4. The method for measuring a microwave electric field at continuous frequencies based on an AC Stark effect of Rydberg atoms according to claim 2, wherein the 852 nm polarization rotator in step 1 is configured to adjust polarization of the detection light.

5. The method for measuring a microwave electric field at continuous frequencies based on an AC Stark effect of Rydberg atoms according to claim 2, wherein the 510 nm half-wave plate and the 510 nm polarization splitting prism in step 2 constitute a power controller of the coupling light.

6. The method for measuring a microwave electric field at continuous frequencies based on an AC Stark effect of Rydberg atoms according to claim 2, wherein the 510 nm polarization rotator in step 2 is configured to adjust polarization of the coupling light.

7. The method for measuring a microwave electric field at continuous frequencies based on an AC Stark effect of Rydberg atoms according to claim 2, wherein the lasers that are of the first laser light source and the second laser light source and that are incident to the cesium sample cell in step 3 have a same polarization direction.

* * * * *